US012800628B2

(12) United States Patent
Matsuura et al.

(10) Patent No.: US 12,800,628 B2
(45) Date of Patent: Nov. 17, 2026

(54) CONTROL DEVICE, CONTROL METHOD, AND CONTROL PROGRAM

(71) Applicant: FUJIFILM CORPORATION, Tokyo (JP)

(72) Inventors: Masayoshi Matsuura, Tokyo (JP); Yuji Ikeda, Tokyo (JP)

(73) Assignee: FUJIFILM CORPORATION, Tokyo (JP)

( * ) Notice: Subject to any disclaimer, the term of this patent is extended or adjusted under 35 U.S.C. 154(b) by 330 days.

(21) Appl. No.: 18/638,601

(22) Filed: Apr. 17, 2024

(65) Prior Publication Data

US 2024/0264209 A1 Aug. 8, 2024

Related U.S. Application Data

(63) Continuation of application No. PCT/JP2022/039187, filed on Oct. 20, 2022.

(30) Foreign Application Priority Data

Oct. 21, 2021 (JP) ................................ 2021-172693

(51) Int. Cl.
*G01R 21/06* (2006.01)
*H02M 3/24* (2006.01)

(52) U.S. Cl.
CPC .............. *G01R 21/06* (2013.01); *H02M 3/24* (2013.01)

(58) Field of Classification Search
None
See application file for complete search history.

(56) References Cited

U.S. PATENT DOCUMENTS 8,416,593 B2 * 4/2013 Xiong ............... H02M 3/33507 363/56.03
9,800,168 B2 * 10/2017 Zou ....................... H02M 5/458
(Continued)

FOREIGN PATENT DOCUMENTS

CN 102638173 A * 8/2012
CN 108923647 A * 11/2018 ........... H02M 3/157
(Continued)

OTHER PUBLICATIONS

English machine translation for CN-102638173-A (Year: 2012).*
(Continued)

*Primary Examiner* — David E Smith
*Assistant Examiner* — Alina Kaliszewski
(74) *Attorney, Agent, or Firm* — SOLARIS Intellectual Property Group, PLLC

(57) ABSTRACT

A control device includes processor causing converter to output a direct current voltage corresponding to output target power, if the output target power is less than or equal to first threshold value and exceeds second threshold value, fix the direct current voltage to first voltage, fix frequency, and control pulse width such that a tube voltage record value matches the output target tube voltage, if the output target power is less than or equal to second threshold value, fix the direct current voltage to first voltage, fix the pulse width, and control frequency such that the tube voltage record value matches the output target tube voltage, and if the output target power is less than or equal to third threshold value, decrease the direct current voltage to second voltage, and control pulse width and frequency such that the tube voltage record value matches the output target tube voltage.

10 Claims, 7 Drawing Sheets

(56) References Cited

U.S. PATENT DOCUMENTS

| | | | | |
|---|---|---|---|---|
| 12,176,801 | B2 * | 12/2024 | Tian | H02J 7/02 |
| 2009/0103337 | A1 * | 4/2009 | Matthews | H02M 7/217 363/84 |
| 2012/0112720 | A1 * | 5/2012 | Remmert | H03K 17/14 323/283 |
| 2015/0070956 | A1 * | 3/2015 | Mu | H02M 7/53871 363/132 |
| 2015/0078528 | A1 * | 3/2015 | Okada | A61B 6/542 378/97 |
| 2015/0117066 | A1 * | 4/2015 | Schmid | H02M 3/33507 363/21.01 |
| 2017/0033681 | A1 * | 2/2017 | Wen | H02M 1/4208 |
| 2017/0310227 | A1 | 10/2017 | Zhang et al. | |
| 2018/0014396 | A1 * | 1/2018 | Imamura | H05G 1/58 |
| 2023/0179112 | A1 * | 6/2023 | Betsuin | H02M 1/083 363/89 |

FOREIGN PATENT DOCUMENTS

| | | | | |
|---|---|---|---|---|
| JP | S61-94568 | A | 5/1986 | |
| JP | H05-335093 | A | 12/1993 | |
| JP | H06-310295 | A | 11/1994 | |
| JP | H07-211485 | A | 8/1995 | |
| JP | 2005-327603 | A | 11/2005 | |
| JP | 2020-115901 | A | 8/2020 | |
| WO | WO-2013115090 | A1 * | 8/2013 | H02M 7/48 |
| WO | WO-2013172320 | A1 * | 11/2013 | H02M 3/3384 |
| WO | WO-2020067323 | A1 * | 4/2020 | A61B 6/56 |

OTHER PUBLICATIONS

English machine translation for WO-2013172320-A1 (Year: 2013).*
English machine translation for WO-2013115090-A1 (Year: 2013).*
English machine translation for CN-108923647-A (Year: 2018).*
English machine translation for WO-2020067323-A1 (Year: 2020).*
Extended European Search Report dated Feb. 20, 2025, issued in corresponding EP Patent Application No. 22883645.8.
International Search Report issued in International Application No. PCT/JP2022/039187 on Nov. 22, 2022.
Written Opinion of the ISA issued in International Application No. PCT/JP2022/039187 on Nov. 22, 2022.

* cited by examiner

FIG. 5

| OUTPUT TARGET POWER | DIRECT CURRENT VOLTAGE | PWM/PFM |
|---|---|---|
| TO 2.0 kW | 310 V | PFM |
| TO 1.2 kW | 290 V | PFM |
| TO 1.0 kW | 290 V | PWM |
| TO 0.9 kW | 280 V | PFM |
| TO 0.6 kW | 280 V | PWM |

33B

FIG. 7

| OUTPUT TARGET POWER | DIRECT CURRENT VOLTAGE | PWM/PFM |
|---|---|---|
| TO 2.0 kW | 310 V | PWM |
| TO 1.2 kW | 290 V | PWM |
| TO 1.0 kW | 290 V | PFM |
| TO 0.9 kW | 280 V | PWM |
| TO 0.6 kW | 280 V | PFM |

33B

FIG. 8

| OUTPUT TARGET POWER | DIRECT CURRENT VOLTAGE | PWM/PFM |
|---|---|---|
| 1.2 TO 2.0 kW | 310 V | PFM |
| 1.0 TO 1.3 kW | 290 V | PFM |
| 0.9 TO 1.1 kW | 290 V | PWM |
| 0.6 TO 1.1 kW | 280 V | PFM |
| TO 0.7 kW | 280 V | PWM |

33B

CONTROL DEVICE, CONTROL METHOD, AND CONTROL PROGRAM

CROSS-REFERENCE TO RELATED APPLICATIONS

This application is a continuation of International Application No. PCT/JP2022/039187, filed on Oct. 20, 2022, which claims priority from Japanese Application No. 2021-172693, filed on Oct. 21, 2021. The entire disclosure of each of the above applications is incorporated herein by reference.

BACKGROUND

Technical Field

The present disclosure relates to a control device, a control method, and a control program.

Related Art

A control device that comprises an inverter circuit that converts a direct current voltage into an alternating current voltage, a step-up circuit that steps up the alternating current voltage output from the inverter circuit, and a rectifier that rectifies the alternating current voltage output from the step-up circuit to a direct current tube voltage, and that controls the tube voltage to be supplied to the radiation tube which emits radiation has been known.

As a technology related to such a control device, JP 2020-115901 A, discloses a technology for adjusting a voltage value of direct current power stepped up by a DC-DC converter on a front stage and a frequency or a duty cycle of an alternating current voltage converted by an inverter circuit such that a detected tube voltage matches a target tube voltage set in advance.

In addition, JP 1995-211485 A (JP H07-211485 A), discloses a technology comprising an inverter control circuit that controls an inverter such that a target tube voltage matches an actual tube voltage of an X-ray tube, and a converter control circuit that controls an output voltage of a converter on a front stage of the inverter to match the target tube voltage.

In supplying the tube voltage to the radiation tube, it is desired to perform high-frequency driving of the inverter circuit for size reduction of the control device. However, in the case of performing the high-frequency driving of the inverter circuit, an adjustment range of a pulse width cannot be secured, and the tube voltage and power to be supplied may not be sufficiently adjusted.

SUMMARY

The present disclosure provides a small-size control device, a control method, and a control program that can sufficiently adjust a tube voltage even in a state where high-frequency driving of an inverter circuit is performed.

A control device of a first aspect of the present disclosure comprises at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, the control device controlling the tube voltage and the tube current supplied to the radiation tube that emits radiation, in which the processor is configured to control the converter to output the direct current voltage corresponding to target output power derived from an output target tube voltage and an output target tube current, in a case where the output target power is less than or equal to a first threshold value and exceeds a second threshold value lower than the first threshold value, fix the direct current voltage to a first voltage, fix a frequency of the inverter circuit, and control a pulse width of the inverter circuit such that a tube voltage record value matches the output target tube voltage, in a case where the output target power is less than or equal to the second threshold value, fix the direct current voltage to the first voltage, fix the pulse width of the inverter circuit, and control the frequency of the inverter circuit such that the tube voltage record value matches the output target tube voltage, and in a case where the output target power is less than or equal to a third threshold value lower than the second threshold value, decrease the direct current voltage to a second voltage lower than the first voltage, and control the pulse width and the frequency of the inverter circuit such that the tube voltage record value matches the output target tube voltage.

In addition, a control device of a second aspect of the present disclosure comprises at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, the control device controlling the tube voltage and the tube current supplied to the radiation tube that emits radiation, in which the processor is configured to control the converter to output the direct current voltage corresponding to output target power derived from an output target tube voltage and an output target tube current, in a case where the output target power is less than or equal to a first threshold value and exceeds a second threshold value lower than the first threshold value, fix the direct current voltage to a first voltage, fix a pulse width of the inverter circuit, and control a frequency of the inverter circuit such that a tube voltage record value matches the output target tube voltage, in a case where the output target power is less than or equal to the second threshold value, fix the direct current voltage to the first voltage, fix the frequency of the inverter circuit, and control the pulse width of the inverter circuit such that the tube voltage record value matches the output target tube voltage, and in a case where the output target power is less than or equal to a third threshold value lower than the second threshold value, decrease the direct current voltage to a second voltage lower than the first voltage, and control the pulse width and the frequency of the inverter circuit such that the tube voltage record value matches the output target tube voltage.

A control device of a third aspect of the present disclosure is the control device of the first aspect or the second aspect, in which the converter may be a DC-DC converter.

A control device of a fourth aspect of the present disclosure is the control device of any one aspect of the first aspect to the third aspect, in which the processor may be configured to decrease the direct current voltage stepwise from the first voltage to the second voltage.

In addition, a control method of a fifth aspect of the present disclosure is a control method executed by a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, the control method comprising controlling the converter to output the direct current voltage corresponding to output target power derived from an output target tube voltage and an output target tube current, in a case where the output target power is less than or equal to a first threshold value and exceeds a second threshold value lower than the first threshold value, fixing the direct current voltage to a first voltage, fixing a frequency of the inverter circuit, and controlling a pulse width of the inverter circuit such that a tube voltage record value matches the output target tube voltage, in a case where the output target power is less than or equal to the second threshold value, fixing the direct current voltage to the first voltage, fixing the pulse width of the inverter circuit, and controlling the frequency of the inverter circuit such that the tube voltage record value matches the output target tube voltage, and in a case where the output target power is less than or equal to a third threshold value lower than the second threshold value, decreasing the direct current voltage to a second voltage lower than the first voltage, and controlling the pulse width and the frequency of the inverter circuit such that the tube voltage record value matches the output target tube voltage.

In addition, a control method of a sixth aspect of the present disclosure is a control method executed by a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, the control method comprising controlling the converter to output the direct current voltage corresponding to output target power derived from an output target tube voltage and an output target tube current, in a case where the output target power is less than or equal to a first threshold value and exceeds a second threshold value lower than the first threshold value, fixing the direct current voltage to a first voltage, fixing a pulse width of the inverter circuit, and controlling a frequency of the inverter circuit such that a tube voltage record value matches the output target tube voltage, in a case where the output target power is less than or equal to the second threshold value, fixing the direct current voltage to the first voltage, fixing the frequency of the inverter circuit, and controlling the pulse width of the inverter circuit such that the tube voltage record value matches the output target tube voltage, and in a case where the output target power is less than or equal to a third threshold value lower than the second threshold value, decreasing the direct current voltage to a second voltage lower than the first voltage, and controlling the pulse width and the frequency of the inverter circuit such that the tube voltage record value matches the output target tube voltage.

In addition, a control program of a seventh aspect of the present disclosure is a control program for causing a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, to execute controlling the converter to output the direct current voltage corresponding to output target power derived from an output target tube voltage and an output target tube current, in a case where the output target power is less than or equal to a first threshold value and exceeds a second threshold value lower than the first threshold value, fixing the direct current voltage to a first voltage, fixing a frequency of the inverter circuit, and controlling a pulse width of the inverter circuit such that a tube voltage record value matches the output target tube voltage, in a case where the output target power is less than or equal to the second threshold value, fixing the direct current voltage to the first voltage, fixing the pulse width of the inverter circuit, and controlling the frequency of the inverter circuit such that the tube voltage record value matches the output target tube voltage, and in a case where the output target power is less than or equal to a third threshold value lower than the second threshold value, decreasing the direct current voltage to a second voltage lower than the first voltage, and controlling the pulse width and the frequency of the inverter circuit such that the tube voltage record value matches the output target tube voltage.

In addition, a control program of an eighth aspect of the present disclosure is a control program for causing a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, to execute controlling the converter to output the direct current voltage corresponding to output target power derived from an output target tube voltage and an output target tube current, in a case where the output target power is less than or equal to a first threshold value and exceeds a second threshold value lower than the first threshold value, fixing the direct current voltage to a first voltage, fixing a pulse width of the inverter circuit, and controlling a frequency of the inverter circuit such that a tube voltage record value matches the output target tube voltage, in a case where the output target power is less than or equal to the second threshold value, fixing the direct current voltage to the first voltage, fixing the frequency of the inverter circuit, and controlling the pulse width of the inverter circuit such that the tube voltage record value matches the output target tube voltage, and in a case where the output target power is less than or equal to a third threshold value lower than the second threshold value, decreasing the direct current voltage to a second voltage lower than the first voltage, and controlling the pulse width and the frequency of the inverter circuit such that the tube voltage record value matches the output target tube voltage.

According to the present disclosure, even in a state where high-frequency driving of an inverter circuit is performed, a tube voltage can be sufficiently adjusted, and size reduction can be achieved.

BRIEF DESCRIPTION OF THE DRAWINGS

FIG. 5 is a diagram for describing an example of target output power control information.

FIG. 7 is a diagram for describing another example of the pulse width, the period, and the control of the pulse width by the control device of the exemplary embodiment.

FIG. 8 is a diagram for describing another example of the pulse width, the period, and the control of the pulse width by the control device of the exemplary embodiment.

DESCRIPTION

Hereinafter, an exemplary embodiment of the present disclosure will be described in detail with reference to the drawings.

Figure 1:
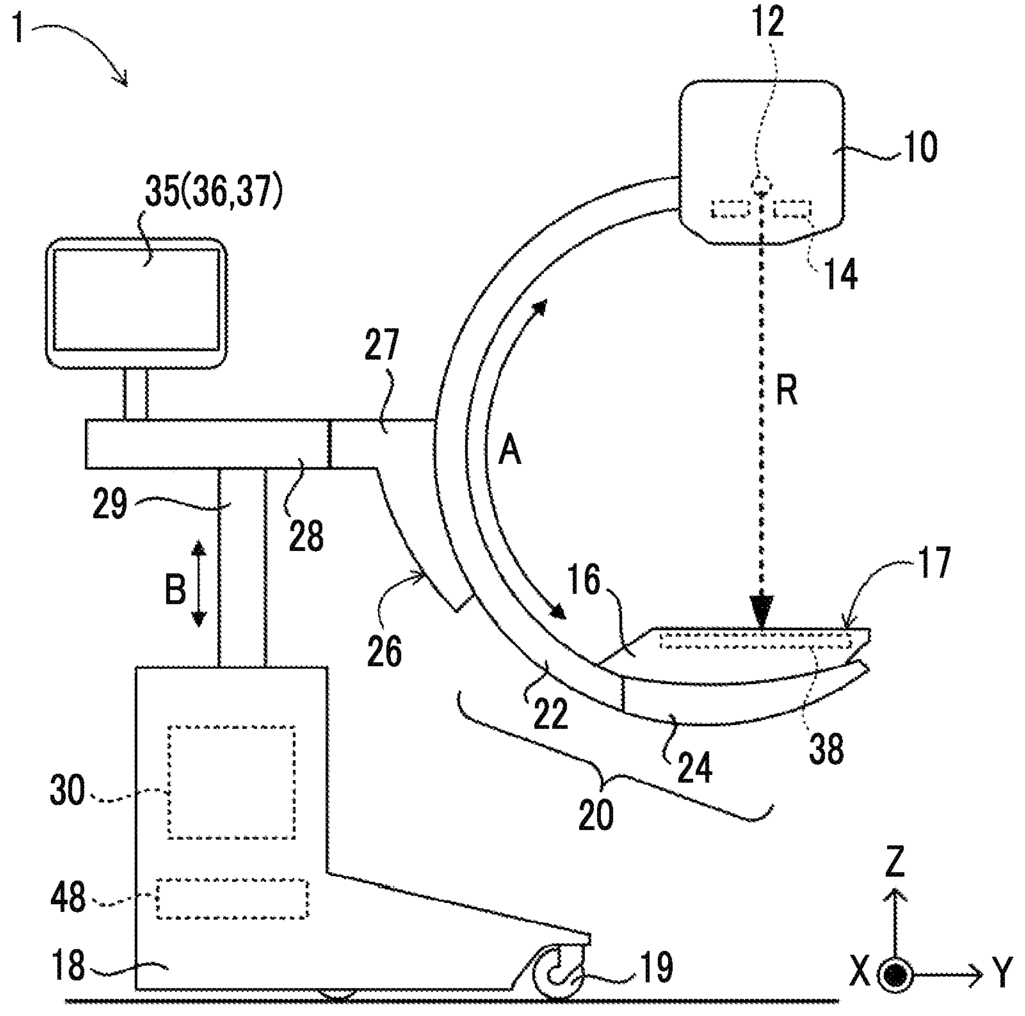
FIG. 1 is a side view illustrating an example of a configuration of a radiography apparatus.

First, a configuration of a mobile type radiography apparatus 1 of the present exemplary embodiment will be described with reference to FIG. 1. As illustrated in FIG. 1, the radiography apparatus 1 comprises a C arm 20 including an arm part 22 and a holding part 24. A radiation emitting unit 10 that emits radiation R generated by a radiation source 12 is provided at one end of the arm part 22.

The radiation emitting unit 10 accommodates the radiation source 12 and an irradiation field limiter 14. The radiation source 12 includes a radiation tube 13 (refer to FIG. 2) that generates the radiation R, and emits the radiation R generated by the radiation tube 13. The radiation tube 13 includes an electron gun (not illustrated) that releases electrons as a tube current in a case where a tube voltage is applied to the radiation tube 13. The irradiation field limiter 14 is a so-called collimator that limits an irradiation field F of the radiation R generated by the radiation tube. The irradiation field limiter 14 has a configuration in which, for example, four cut-out plates of lead that cut the radiation R are disposed on each side of a quadrangle and in which an opening part of the quadrangle through which the radiation R is transmitted is formed in a center part. The irradiation field limiter 14 changes the irradiation field of the radiation R by changing a position of each cut-out plate to change a size of the opening part.

As illustrated in FIG. 1, the holding part 24 is provided at the other end of the arm part 22. The holding part 24 holds an accommodation part 16. The accommodation part 16 accommodates a radiation detector 38 that generates image data indicating a radiation image by detecting the radiation R. The C arm 20 of the present exemplary embodiment is configured to change an angle of the radiation detector 38 with respect to a Z axis direction illustrated in FIG. 1 (in the example in FIG. 1, a vertical direction).

The radiation detector 38 detects the radiation R that has passed through a subject. Specifically, the radiation detector 38 detects the radiation R that has entered the accommodation part 16 and that has reached a detection surface of the radiation detector 38, generates the radiation image based on the detected radiation R, and outputs the image data indicating the generated radiation image. Hereinafter, the series of operations of generating the radiation image via the radiation detector 38 by performing irradiation with the radiation R from the radiation source 12 may be referred to as "imaging". A type of the radiation detector 38 is not particularly limited and may be, for example, a radiation detector of an indirect conversion type that converts the radiation R into light and that converts the converted light into charges or a radiation detector of a direct conversion type that directly converts the radiation R into charges. In addition, the radiation detector 38 can capture at least one of a static image or a video image. The radiation image captured as a video image is referred to as a radiographic image.

As illustrated in FIG. 1, a detection surface 17 on which the radiation R of the irradiation from the radiation emitting unit 10 is detected in the accommodation part 16 is provided to face the radiation emitting unit 10. In the radiography apparatus 1 of the present exemplary embodiment, a so-called source image distance (SID) that is a distance between the detection surface 17 and the radiation source 12 of the radiation emitting unit 10 is a fixed value.

The C arm 20 is held to be movable in a direction of arrow A illustrated in FIG. 1 by a C arm holding part 26. In addition, the C arm holding part 26 includes a shaft part 27, and the shaft part 27 connects the C arm 20 to a bearing 28. The C arm 20 can rotate about the shaft part 27 as a rotation axis. In addition, the radiography apparatus 1 comprises a body part 18 in which a plurality of wheels 19 are provided in its bottom part. A support shaft 29 that extends and retracts in the Z axis direction in FIG. 1 is provided on an upper side of a housing of the body part 18 in FIG. 1. The bearing 28 is held to be movable in a direction of arrow B above the support shaft 29.

In addition, a user interface unit 35 including a display 36 and an operating part 37 is provided above the body part 18. The display 36 and the operating part 37 function as a user interface. The display 36 presents information related to the captured radiation image and capturing of the radiation image to an operator such as a technician and a doctor who capture the radiation image using the radiography apparatus 1. Examples of the display 36 include a liquid crystal display. In the present exemplary embodiment, a touch panel display in which the display 36 and the operating part 37 are integrated is applied. In addition, the operating part 37 is operated by the operator in providing an instruction related to capturing of the radiation image. Examples of the operating part 37 include various switches, a touch panel, a touch pen, and a mouse. In addition, a plurality of the operating parts 37 may be provided. For example, a touch panel and a foot switch operated by the operator using a foot may be provided as the operating parts 37.

In addition, a control device 30 that controls the tube voltage and the tube current to be supplied to the radiation tube 13 of the radiation source 12, and a power supply unit 48 that supplies power to each unit of the radiography apparatus 1 are accommodated inside the body part 18.

Figure 2:
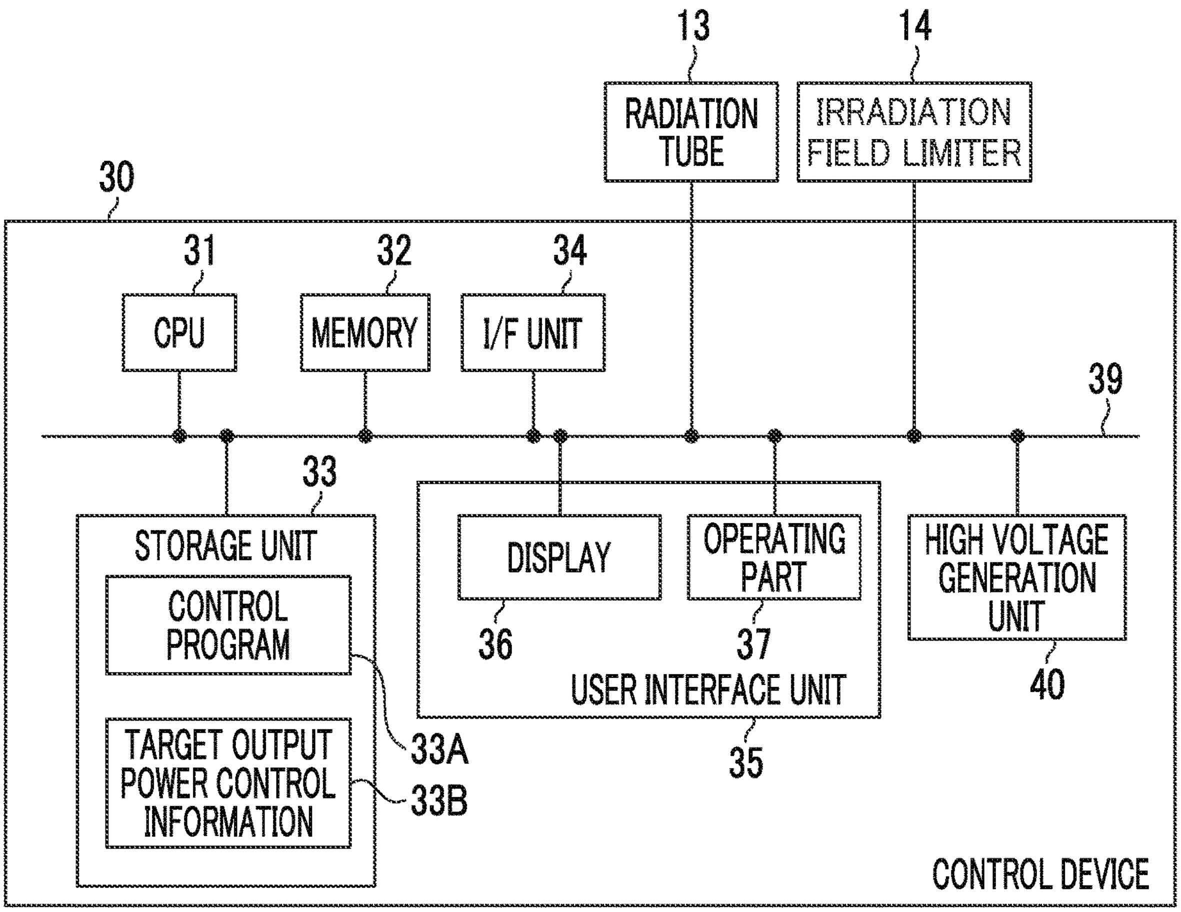
FIG. 2 is a block diagram illustrating an example of the configuration of the control device of an exemplary embodiment.

Next, a hardware configuration of the control device 30 of the present exemplary embodiment will be described with reference to FIG. 2. As illustrated in FIG. 2, the control device 30 includes a central processing unit (CPU) 31, a memory 32 as a temporary storage region, a non-volatile storage unit 33, an interface (I/F) unit 34, the user interface unit 35 including the display 36 and the operating part 37, and a high voltage generation unit 40. The CPU 31, the memory 32, the storage unit 33, the I/F unit 34, the display 36, the operating part 37, and the high voltage generation unit 40 are connected to a bus 39. In addition, the radiation tube 13 and the irradiation field limiter 14 are also connected to the bus 39.

The storage unit 33 is implemented using a hard disk drive (HDD), a solid state drive (SSD), a flash memory, or the like. The storage unit 33 as a storage medium stores a control program 33A. The CPU 31 reads out the control program 33A from the storage unit 33 and then loads the control program 33A into the memory 32 and executes the loaded control program 33A.

In addition, the storage unit 33 stores target output power control information 33B for obtaining target output power, described later in detail.

The I/F unit 34 communicates various types of information with the radiation detector 38 using wireless communication or wired communication. In addition, the I/F unit 34 communicates various types of information with an external apparatus through a network using wired communication or wired communication. Examples of the external apparatus include a radiology information system (RIS) that manages imaging orders, and picture archiving and communication systems (PACS).

The high voltage generation unit 40 has a function of generating the tube voltage and the tube current corresponding to an exposure condition and supplying the tube voltage and the tube current to the radiation tube 13. Details of the high voltage generation unit 40 will be described later.

Figure 3:
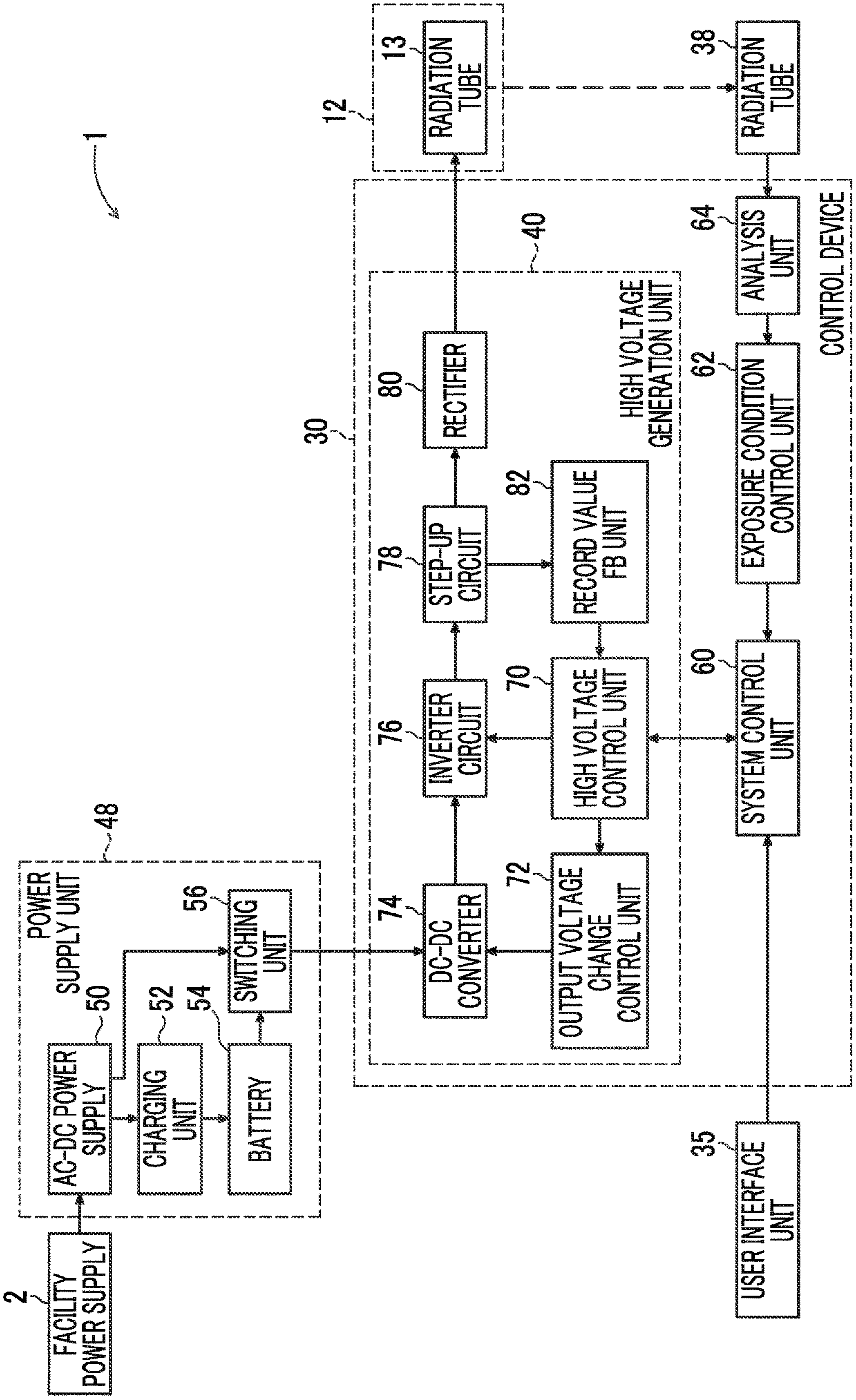
FIG. 3 is a functional block diagram of an example of a configuration of a control device of the exemplary embodiment.

Next, a functional configuration of the control device 30 of the present exemplary embodiment will be described with reference to FIG. 3. As illustrated in FIG. 3, the control device 30 comprises the high voltage generation unit 40, a system control unit 60, an exposure condition control unit 62, and an analysis unit 64. For example, the control device 30 functions as the system control unit 60, the exposure condition control unit 62, and the analysis unit 64 by executing the control program 33A via the CPU 31.

The analysis unit 64 performs image analysis for controlling a dose of the radiation R with respect to the radiation image. In addition, the exposure condition control unit 62 has a function of controlling the exposure condition in accordance with a result of the image analysis of the analysis unit 64. Examples of the image analysis by the analysis unit 64 include processing of generating a shade histogram. For example, in a case where it is determined that the radiation image is darker than expected using the shade histogram, the exposure condition control unit 62 derives the exposure condition to increase the dose of the radiation R from the immediately previous dose in capturing the radiation image in a subsequent frame in video capturing, and outputs the derived exposure condition to the system control unit 60.

The system control unit 60 has a function of performing a control for supplying the tube voltage and the tube current for obtaining the target output power to the radiation tube 13 from the high voltage generation unit 40 based on the exposure condition input by a user using the user interface unit 35 or on the exposure condition output from the exposure condition control unit 62. The system control unit 60 derives output power as a target from a tube voltage as a target and a tube current as a target corresponding to the exposure condition and outputs the tube voltage as the target, the tube current as the target, and the output power as the target to a high voltage control unit 70. In the present exemplary embodiment, the tube voltage as the target, the tube current as the target, and the output power as the target will be referred to as a "target tube voltage", a "target tube current" and the "target output power", respectively.

The high voltage generation unit 40 includes the high voltage control unit 70, an output voltage change control unit 72, a direct current (DC)-DC converter 74, an inverter circuit 76, a step-up circuit 78, a rectifier 80, and a record value feedback (FB) unit 82. For example, the control device 30 functions as the high voltage control unit 70 and the output voltage change control unit 72 by executing the control program 33A via the CPU 31.

The DC-DC converter 74 has a function of outputting a direct current voltage from a direct current power supply voltage supplied from the power supply unit 48. As illustrated in FIG. 3, the power supply unit 48 of the present exemplary embodiment includes an alternating current (AC)-DC power supply 50, a charging unit 52, a battery 54, and a switching unit 56. An alternating current power supply voltage is supplied to the AC-DC power supply 50 by connecting the AC-DC power supply 50 to an outlet of a facility power supply 2 of a facility in which the radiography apparatus 1 is installed. The AC-DC power supply 50 converts the supplied alternating current power supply voltage into the direct current power supply voltage. The battery 54 is a battery for wirelessly driving the radiography apparatus 1, and the charging unit 52 charges the battery 54 using the direct current power supply voltage supplied from the AC-DC power supply 50. The switching unit 56 has a function of switching a supply source of the direct current power supply voltage to be supplied to the high voltage generation unit 40 to any of the AC-DC power supply 50 and the battery 54.

The DC-DC converter 74 of the present exemplary embodiment converts the direct current power supply voltage supplied from the power supply unit 48 into the direct current voltage corresponding to the target output power and outputs the direct current voltage to the inverter circuit 76 under control of the output voltage change control unit 72. For example, in the present exemplary embodiment, the power supply voltage supplied from the power supply unit 48 is lower than the direct current voltage (target tube voltage) corresponding to the target output power. Thus, the DC-DC converter 74 steps up the direct current power supply voltage supplied from the power supply unit 48 to the direct current voltage corresponding to the target output power and outputs the direct current voltage to the inverter circuit 76.

The inverter circuit 76 includes a plurality of switching elements and has a function of converting the direct current voltage output from the DC-DC converter 74 into an alternating current voltage. The inverter circuit 76 may be of a resonant type or a non-resonant type.

The step-up circuit 78 steps up and outputs the alternating current voltage output from the inverter circuit 76 in accordance with the target tube voltage.

The rectifier 80 rectifies the alternating current voltage output from the step-up circuit 78 to the direct current tube voltage and supplies the direct current tube voltage to the radiation tube 13.

The record value FB unit 82 has a function of detecting the alternating current voltage after the step-up by the step-up circuit 78 and feeding back the detected alternating current voltage to the high voltage control unit 70 as a record value of the tube voltage supplied to the radiation tube 13. Hereinafter, the record value of the tube voltage will be referred to as a "tube voltage record value".

The high voltage control unit 70 has a function of controlling a high voltage generated by the high voltage generation unit 40 by controlling the direct current voltage output from the DC-DC converter 74 and the alternating current voltage output from the inverter circuit 76. Specifically, the high voltage generation unit 40 outputs the target output power input from the system control unit 60 to the output voltage change control unit 72.

The output voltage change control unit 72 has a function of controlling the direct current voltage output from the DC-DC converter 74. Specifically, the direct current voltage output from the DC-DC converter 74 is changed by controlling a degree of the step-up in the DC-DC converter 74 in accordance with the target output power in an instruction provided from the high voltage control unit 70.

In addition, the high voltage control unit 70 performs at least one of pulse frequency modulation (PFM) of controlling a frequency or pulse width modulation (PWM) of controlling a pulse width for alternating current power converted by the inverter circuit 76, on the inverter circuit 76 such that the tube voltage record value input from the record value FB unit 82 matches the target tube voltage input from the system control unit 60.

Here, a control of the target output power by the control device 30 of the present exemplary embodiment will be described. The control device 30 controls the direct current voltage output from the DC-DC converter 74 and the frequency and the pulse width of the alternating current power converted by the inverter circuit 76 in accordance with the target output power.

Figure 4:
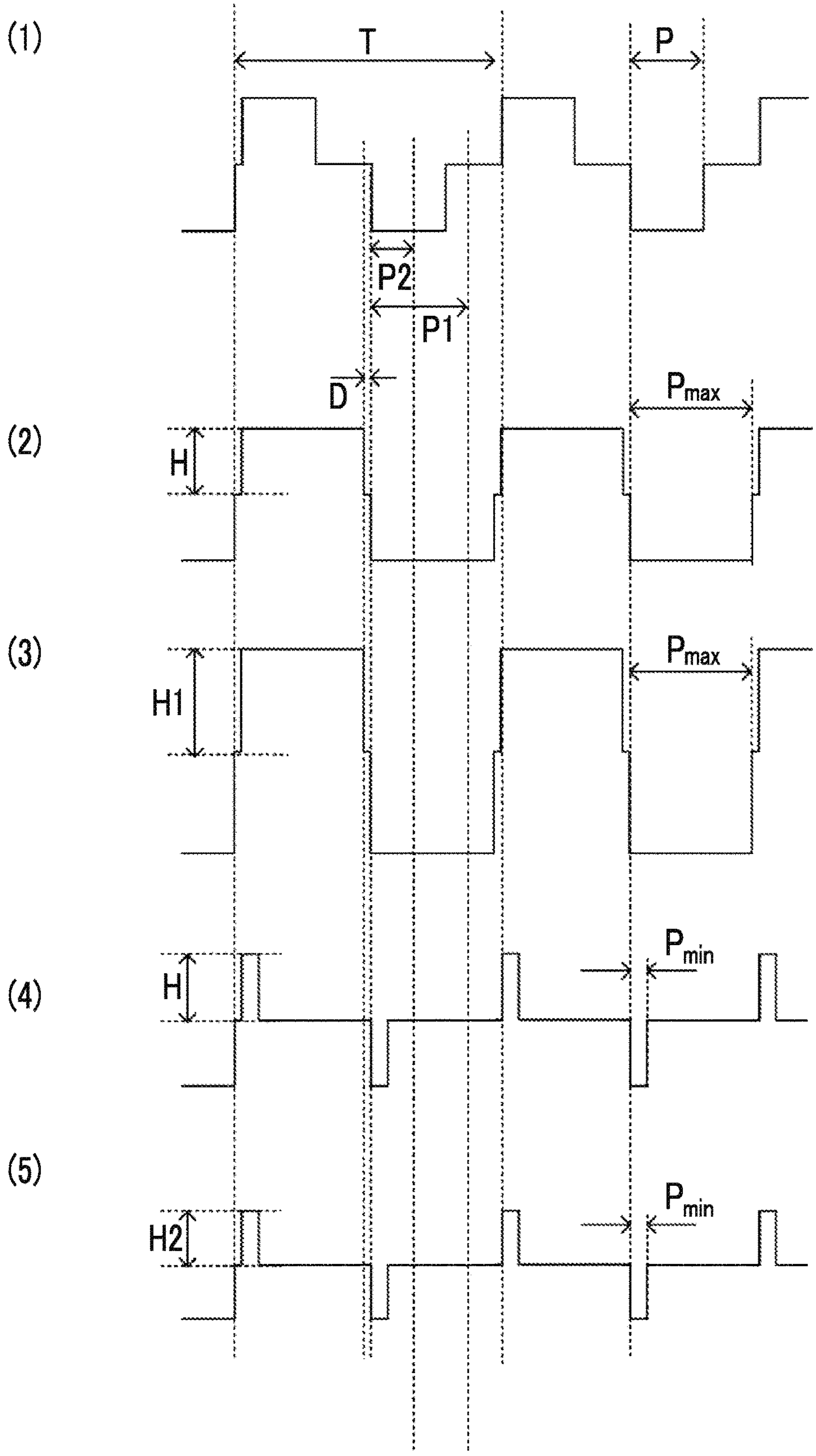
FIG. 4 is a diagram for describing an example of a pulse width, a period, and a control of the pulse width by the control device of the exemplary embodiment.

As illustrated in (1) of FIG. 4, alternating current power having a pulse of a pulse width P in a period Tis output from the inverter circuit 76. A frequency f of the alternating current power is represented by Expression (1) below.

$$f = 1/T \tag{1}$$

Increasing the pulse width P increases the alternating current power. In addition, increasing the frequency f to a high frequency, in other words, decreasing the period T, increases the alternating current power. Thus, in a case where the alternating current power output from the inverter circuit 76 is to be increased, that is, in a case where the tube voltage record value is smaller than the target tube voltage, the high voltage control unit 70 performs at least one of a control of increasing the frequency f (decreasing the period T) or a control of increasing the pulse width P. As illustrated in (2) of FIG. 4, a maximum pulse width Pmax is determined in advance. For example, the maximum pulse width Pmax is determined in accordance with the period T and a dead time D. The dead time D is a time required for switching between positive alternating current power and negative alternating current power.

In addition, even in a case where the tube voltage record value is smaller than the target tube voltage with the maximum pulse width Pmax, the output voltage change control unit 72 increases the direct current voltage output from the DC-DC converter 74. Accordingly, a height of the pulse is increased (raised) as illustrated in (3) of FIG. 4. A height H1 of the pulse of the alternating current power illustrated in (3) of FIG. 4 is greater than a height H of the pulse of the alternating current power illustrated in (2) of FIG. 4 (H1>H).

Meanwhile, decreasing the pulse width P decreases the alternating current power. In addition, decreasing the frequency f to a low frequency, in other words, increasing the period T, decreases the alternating current power. Thus, in a case where the alternating current power output from the inverter circuit 76 is to be decreased, that is, in a case where the tube voltage record value is greater than the target tube voltage, the high voltage control unit 70 performs at least one of a control of decreasing the frequency f (increasing the period T) or a control of decreasing the pulse width P. As illustrated in (4) of FIG. 4, a minimum pulse width Pmin is determined in advance.

In addition, in the present exemplary embodiment, even in a case where the tube voltage record value is greater than the target tube voltage with the minimum pulse width Pmin, the output voltage change control unit 72 decreases the direct current voltage output from the DC-DC converter 74. Accordingly, the height of the pulse is decreased (lowered) as illustrated in (5) of FIG. 4. A height H2 of the pulse of the alternating current power illustrated in (5) of FIG. 4 is smaller than the height H of the pulse of the alternating current power illustrated in (4) of FIG. 4 (H2<H).

It is preferable to determine the maximum pulse width Pmax and the minimum pulse width Pmin of the pulse width P with a margin with respect to the period T. In the example illustrated in (1) of FIG. 4, the maximum pulse width Pmax is a pulse width P1, and the minimum pulse width Pmin is a pulse width P2.

The control device 30 of the present exemplary embodiment fixes the pulse width of the inverter circuit 76 and decreases the frequency using the PFM control, in a case where it is difficult to perform adjustment using the frequency, decreases the pulse width by switching to the PWM control, and in a case where it is difficult to perform adjustment using the pulse width, decreases the direct current voltage to be output from the DC-DC converter 74.

Specifically, in a case where the output target power is less than or equal to a first threshold value and exceeds a second threshold value lower than the first threshold value, the control device 30 of the present exemplary embodiment fixes the direct current voltage output from the DC-DC converter 74 to a first voltage, fixes the pulse width of the inverter circuit 76, and performs the PFM control of controlling the frequency of the inverter circuit 76 such that the tube voltage record value matches the output target tube voltage. In addition, in a case where the output target power is less than or equal to the second threshold value, the control device 30 fixes the direct current voltage output from the DC-DC converter 74 to the first voltage, fixes the frequency of the inverter circuit 76, and performs the PWM control of controlling the pulse width of the inverter circuit 76 such that the tube voltage record value matches the output target tube voltage. Furthermore, in a case where the output target power is less than or equal to a third threshold value lower than the second threshold value, the control device 30 decreases the direct current voltage output from the DC-DC converter 74 to a second voltage lower than the first voltage and performs the PWM control of controlling the pulse width and the PFM control of controlling the frequency of the inverter circuit such that the tube voltage record value matches the output target tube voltage.

For example, in the present exemplary embodiment, the target output power control information 33B indicating a correspondence relationship among the target output power as information for operating as described above, the direct current voltage output from the DC-DC converter 74, and any of the PWM control and the PFM control to be performed is stored in the storage unit 33. FIG. 5 illustrates an example of the target output power control information 33B.

In the target output power control information 33B illustrated in FIG. 5, in a case where the output target power is less than or equal to 2.0 kW and exceeds 1.2 kW, the output voltage change control unit 72 causes the DC-DC converter 74 to output the direct current voltage of 310 V. In addition, the high voltage control unit 70 performs the PFM control while fixing the pulse width of the inverter circuit 76 such that the tube voltage record value matches the target tube voltage. In addition, in a case where the output target power is less than or equal to 1.2 kW and exceeds 1.0 KW, the output voltage change control unit 72 decreases the direct current voltage output by the DC-DC converter 74 to 290 V. In the case of decreasing the direct current voltage output by the DC-DC converter 74, the direct current voltage may be decreased stepwise or may be continuously decreased using an analog voltage. In the case of decreasing the direct current voltage stepwise, a circuit can be simplified, and size reduction of the high voltage generation unit 40 can be achieved, compared to the case of continuously decreasing the direct current voltage. In addition, the number of steps in the case of decreasing the direct current voltage output by the DC-DC converter 74 is not limited to the present exemplary embodiment. The direct current voltage may be more finely changed than that in the present exemplary embodiment through, for example, 10 steps.

In addition, the high voltage control unit 70 performs the PFM control while fixing the pulse width of the inverter circuit 76 such that the tube voltage record value matches the target tube voltage. In addition, in a case where the output target power is less than or equal to 1.0 KW and exceeds 0.9 kW, the output voltage change control unit 72 maintains the direct current voltage output by the DC-DC converter 74, which is fixed to 290 V. In addition, the high voltage control unit 70 performs the PWM control while fixing the frequency of the inverter circuit 76 such that the tube voltage record value matches the target tube voltage. In addition, in a case where the output target power is less than or equal to 0.9 kW and exceeds 0.6 kW, the output voltage change control unit 72 decreases the direct current voltage output by the DC-DC converter 74 to 280 V. In addition, the high voltage control unit 70 performs the PFM control while fixing the pulse width of the inverter circuit 76 such that the tube voltage record value matches the target tube voltage. In addition, in a case where the output target power is less than or equal to 0.6 kW, the output voltage change control unit 72 maintains the direct current voltage output by the DC-DC converter 74, which is fixed to 280 V. In addition, the high voltage control unit 70 performs the PWM control while fixing the frequency of the inverter circuit 76 such that the tube voltage record value matches the target tube voltage.

In the target output power control information 33B, output target power: 1.2 kW and 0.9 kW is an example of the first threshold value, output target power: 1.0 kW and 0.6 kW is an example of the second threshold value, and output target power: 0.8 kW is an example of the third threshold value.

Figure 6:
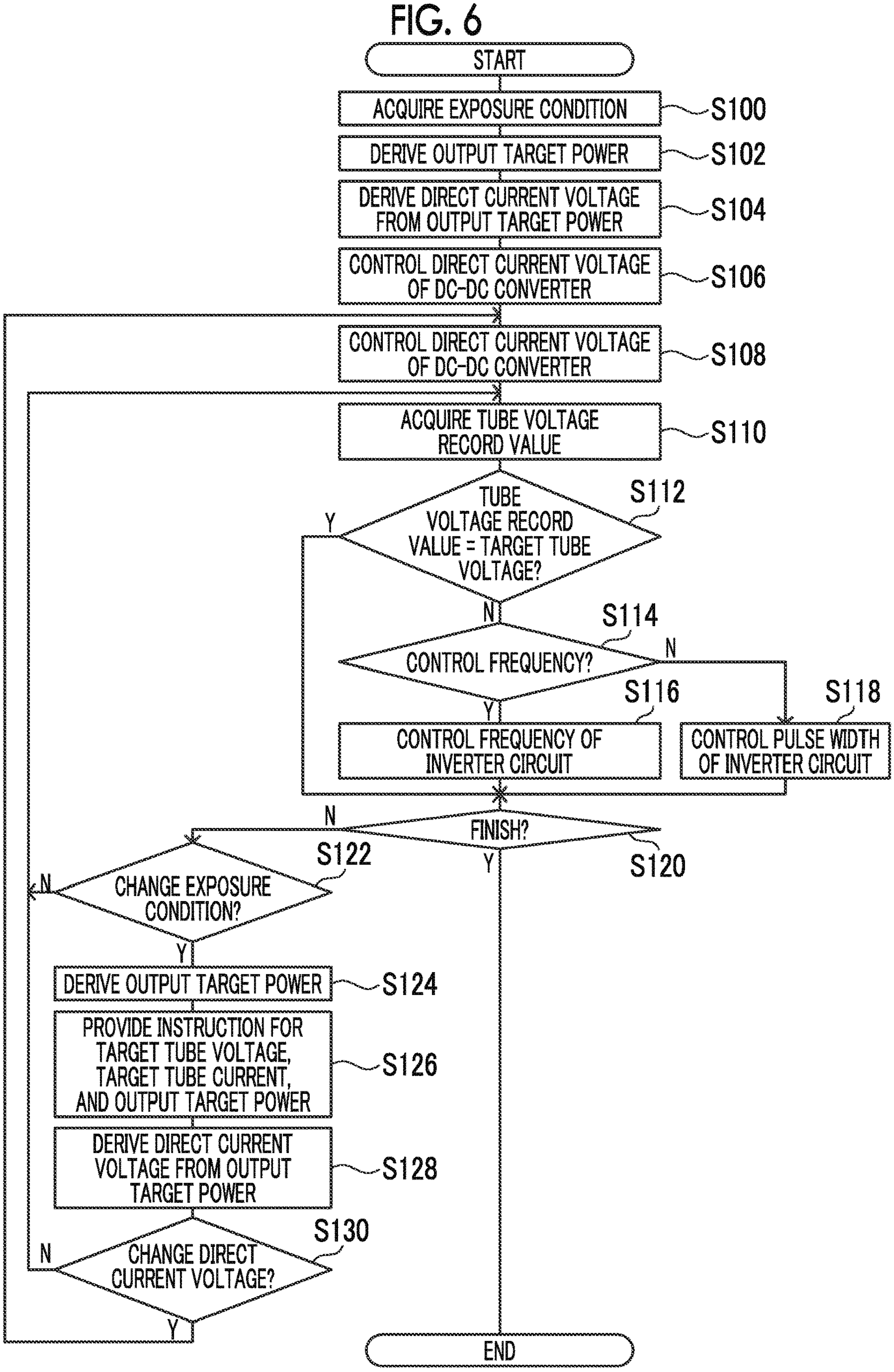
FIG. 6 is a flowchart illustrating an example of a flow of tube voltage control processing by the control device of the exemplary embodiment.

Next, an action of the control device 30 of the present exemplary embodiment will be described with reference to FIG. 6. Tube voltage control processing illustrated in FIG. 6 is executed by executing the control program 33A via the CPU 31. The tube voltage control processing illustrated in FIG. 6 is executed in a case where, for example, an instruction to start capturing the radiation image is input into the control device 30.

In step S100 in FIG. 6, the system control unit 60 acquires the exposure condition including the output target tube voltage and the output target tube current.

In subsequent step S102, the system control unit 60 derives the output target power from the output target tube voltage and the output target tube current acquired in step S100.

In subsequent step S104, the system control unit 60 outputs the target tube voltage and the target tube current corresponding to the exposure condition acquired in step S100 and the output target power derived in step S102 to the high voltage control unit 70.

In subsequent step S106, the output voltage change control unit 72 derives the direct current voltage to be output from the DC-DC converter 74 from the output target power. For example, as described above, the output voltage change control unit 72 derives the direct current voltage corresponding to a target output voltage by referring to the target output power control information 33B.

In subsequent step S108, the output voltage change control unit 72 controls the DC-DC converter 74 such that the direct current voltage derived in step S106 is output from the DC-DC converter 74. Accordingly, the direct current voltage output from the DC-DC converter 74 is converted into the alternating current power by the inverter circuit 76, stepped up by the step-up circuit 78, rectified to the direct current tube voltage by the rectifier 80, and supplied to the radiation tube 13. In addition, the record value FB unit 82 detects the tube voltage record value stepped up by the step-up circuit 78.

Therefore, in subsequent step S110, the high voltage control unit 70 acquires the tube voltage record value from the record value FB unit 82.

In subsequent step S112, the high voltage control unit 70 determines whether or not the tube voltage record value and the target tube voltage match (tube voltage record value=target tube voltage). The tube voltage record value and the target tube voltage may not completely match and may be considered to match by taking an error into consideration. In a case where the tube voltage record value and the target tube voltage match, a positive determination is made in the determination in step S112, and a transition is made to step S120. Meanwhile, in a case where the tube voltage record value and the target tube voltage do not match, a negative determination is made in the determination in step S112, and a transition is made to step S114.

In step S114, the high voltage control unit 70 determines whether or not to perform the frequency control (PFM). For example, as described above, the high voltage control unit 70 determines which of the PFM and the PWM is the control corresponding to the target output voltage by referring to the target output power control information 33B. In the case of performing the frequency control (PFM), a positive determination is made in the determination in step S114, and a transition is made to step S116. In step S116, the high voltage control unit 70 performs the frequency control (PFM) while fixing the pulse width of the inverter circuit 76 and then transitions to step S120. Specifically, in a case where the tube voltage record value is greater than the target tube voltage, the high voltage control unit 70 decreases the frequency of the inverter circuit 76. Meanwhile, in a case where the tube voltage record value is smaller than the target tube voltage, the high voltage control unit 70 increases the frequency of the inverter circuit 76.

Meanwhile, in the case of not performing the frequency control (PFM), a negative determination is made in the determination in step S114, and a transition is made to step S118. In step S118, the high voltage control unit 70 performs the pulse width control (PWM) while fixing the frequency of the inverter circuit 76 and then transitions to step S120. Specifically, in a case where the tube voltage record value is greater than the target tube voltage, the high voltage control unit 70 decreases the pulse width of the inverter circuit 76. Meanwhile, in a case where the tube voltage record value is smaller than the target tube voltage, the high voltage control unit 70 increases the pulse width of the inverter circuit 76.

In step S120, the system control unit 60 determines whether or not to finish the tube voltage control processing illustrated in FIG. 6. In the present exemplary embodiment, the tube voltage control processing illustrated in FIG. 6 is finished in a case where a predetermined finish condition is satisfied. Examples of the predetermined finish condition include a condition that the tube voltage control processing is finished in a case where a predetermined exposure time has reached because the irradiation with the radiation is finished. In a case where the predetermined finish condition is not satisfied, a negative determination is made in the determination in step S120, and a transition is made to step S122.

In step S122, the system control unit 60 determines whether or not to change the exposure condition. As described above, for example, in capturing the radiation image in the subsequent frame in the video capturing, the exposure condition may be changed in order to change the dose of the radiation R from the dose of the radiation R with which irradiation is immediately previously performed. The system control unit 60 determines whether or not an instruction to change the exposure condition is provided from the exposure condition control unit 62 based on an analysis result of the analysis unit 64. In the case of not changing the exposure condition, a negative determination is made in the determination in step S122, and a return is made to step S110 to repeat the processing of steps S110 to S120. Meanwhile, in the case of changing the exposure condition, a positive determination is made in the determination in step S122, and a transition is made to step S124.

In step S124, the system control unit 60 derives the output target power from the output target tube voltage and the output target tube current corresponding to the exposure condition determined to be changed in step S122.

In subsequent step S126, the system control unit 60 outputs the target tube voltage and the target tube current corresponding to the exposure condition determined to be changed in step S122 and the output target power derived in step S124 to the high voltage control unit 70.

In subsequent step S128, the output voltage change control unit 72 derives the direct current voltage to be output from the DC-DC converter 74 from the output target power. For example, as described above, the output voltage change control unit 72 derives the direct current voltage corresponding to the target output voltage by referring to the target output power control information 33B.

In subsequent step S130, the output voltage change control unit 72 determines whether or not to change the direct current voltage to be output from the DC-DC converter 74. In a case where the direct current voltage derived in step S128 is the same as the direct current voltage currently output from the DC-DC converter 74, a negative determination is made in the determination in step S130, and a return is made to step S110. Meanwhile, in a case where the direct current voltage derived in step S128 is not the same as the direct current voltage currently output from the DC-DC converter 74, a positive determination is made in the determination in step S130, and a return is made to step S108. In the case of changing the exposure condition in the middle of performing the video capturing, there is a difference in time between a change of the tube current and a change of a filament current. Thus, it is preferable to change the direct current voltage to be output from the DC-DC converter 74 by taking the difference in time into consideration.

Meanwhile, in a case where the predetermined finish condition is satisfied, a positive determination is made in the determination in step S120, and the tube voltage control processing illustrated in FIG. 6 is finished.

Accordingly, the control device 30 of the present exemplary embodiment controls the DC-DC converter 74 to output the direct current voltage corresponding to the output target power derived from the output target tube voltage and the output target tube current. In a case where the output target power is less than or equal to the first threshold value and exceeds the second threshold value lower than the first threshold value, the control device 30 fixes the direct current voltage output from the DC-DC converter 74 to the first voltage, fixes the pulse width of the inverter circuit 76, and performs the PFM control of controlling the frequency of the inverter circuit 76 such that the tube voltage record value matches the output target tube voltage. In addition, in a case where the output target power is less than or equal to the second threshold value, the control device 30 fixes the direct current voltage output from the DC-DC converter 74 to the first voltage, fixes the frequency of the inverter circuit 76, and performs the PFM control of controlling the pulse width of the inverter circuit 76 such that the tube voltage record value matches the output target tube voltage. Furthermore, in a case where the output target power is less than or equal to the third threshold value lower than the second threshold value, the control device 30 decreases the direct current voltage output from the DC-DC converter 74 to the second voltage lower than the first voltage and performs the PFM control of controlling the pulse width and performs the PFM control of controlling the frequency of the inverter circuit such that the tube voltage record value matches the output target tube voltage.

In the case of performing high-frequency driving of the inverter circuit 76, the period T is decreased. Thus, an adjustment range of the pulse width is narrowed. Accordingly, the high-frequency driving of the inverter circuit 76 and the control of the pulse width are in a trade-off relationship, and the tube voltage may not be sufficiently adjusted. Meanwhile, the control device 30 of the present exemplary embodiment controls the direct current voltage output from the DC-DC converter 74 in accordance with the target output voltage and also controls the tube voltage in combination with the PWM control and the PFM control. Thus, the control device 30 can sufficiently adjust the tube voltage even in a state where the high-frequency driving of the inverter circuit 76 is maintained. In addition, since the high-frequency driving of the inverter circuit 76 can be performed, a size of a transformer of the step-up circuit 78 can be decreased, and size reduction of the high voltage generation unit 40 can be achieved.

A form of the control device 30 of the exemplary embodiment that fixes the pulse width of the inverter circuit 76 and decreases the frequency using the PFM control, in a case where it is difficult to perform adjustment using the frequency, decreases the pulse width by switching to the PWM control, and in a case where it is difficult to perform adjustment using the pulse width, decreases the direct current voltage to be output from the DC-DC converter 74 has been described. However, the control device 30 is not limited to the present form. For example, a form of the control device 30 that fixes the frequency of the inverter circuit 76 and decreases the pulse width using the PWM control, in a case where it is difficult to perform adjustment using the pulse width, decreases the frequency by switching to the PFM control, and in a case where it is difficult to perform adjustment using the frequency, decreases the direct current voltage to be output from the DC-DC converter 74 is also possible.

Specifically, in a case where the output target power is less than or equal to the first threshold value and exceeds the second threshold value lower than the first threshold value, the control device 30 of the present exemplary embodiment fixes the direct current voltage output from the DC-DC converter 74 to the first voltage, fixes the frequency of the inverter circuit 76, and performs the PWM control of controlling the pulse width of the inverter circuit 76 such that the tube voltage record value matches the output target tube voltage. In addition, in a case where the output target power is less than or equal to the second threshold value, the control device 30 fixes the direct current voltage output from the DC-DC converter 74 to the first voltage, fixes the pulse width of the inverter circuit 76, and performs the PFM control of controlling the frequency of the inverter circuit 76 such that the tube voltage record value matches the output target tube voltage. Furthermore, in a case where the output target power is less than or equal to the third threshold value lower than the second threshold value, the control device 30 decreases the direct current voltage output from the DC-DC converter 74 to the second voltage lower than the first voltage and performs the PWM control of controlling the pulse width and the PFM control of controlling the frequency of the inverter circuit such that the tube voltage record value matches the output target tube voltage.

FIG. 7 illustrates an example of the target output power control information 33B in this case. In the target output power control information 33B illustrated in FIG. 7, in a case where the output target power is less than or equal to 2.0 kW and exceeds 1.2 kW, the output voltage change control unit 72 causes the DC-DC converter 74 to output the direct current voltage of 310 V. In addition, the high voltage control unit 70 performs the PWM control while fixing the frequency of the inverter circuit 76 such that the tube voltage record value matches the target tube voltage. In addition, in a case where the output target power is less than or equal to 1.2 kW and exceeds 1.0 kW, the output voltage change control unit 72 decreases the direct current voltage output by the DC-DC converter 74 to 290 V. In addition, the high voltage control unit 70 performs the PWM control while fixing the frequency of the inverter circuit 76 such that the tube voltage record value matches the target tube voltage. In addition, in a case where the output target power is less than or equal to 1.0 KW and exceeds 0.9 kW, the output voltage change control unit 72 maintains the direct current voltage output by the DC-DC converter 74, which is fixed to 290 V. In addition, the high voltage control unit 70 performs the PFM control while fixing the pulse width of the inverter circuit 76 such that the tube voltage record value matches the target tube voltage. In addition, in a case where the output target power is less than or equal to 0.9 kW and exceeds 0.6 kW, the output voltage change control unit 72 decreases the direct current voltage output by the DC-DC converter 74 to 280 V. In addition, the high voltage control unit 70 performs the PWM control while fixing the frequency of the inverter circuit 76 such that the tube voltage record value matches the target tube voltage. In addition, in a case where the output target power is less than or equal to 0.6 kW, the output voltage change control unit 72 maintains the direct current voltage output by the DC-DC converter 74, which is fixed to 280 V. In addition, the high voltage control unit 70 performs the PFM control while fixing the pulse width of the inverter circuit 76 such that the tube voltage record value matches the target tube voltage. In the target output power control information 33B illustrated in FIG. 7, output target power: 1.2 kW and 0.9 kW is an example of the first threshold value, output target power: 1.0 kW and 0.6 kW is an example of the second threshold value, and output target power: 0.8 kW is an example of the third threshold value.

The control device 30 executes the tube voltage control processing illustrated in FIG. 6 by referring to the target output power control information 33B. Accordingly, as described above, the control device 30 controls the direct current voltage output from the DC-DC converter 74 in accordance with the target output voltage and also controls the tube voltage in combination with the PWM control and the PFM control. Thus, the control device 30 can sufficiently adjust the tube voltage even in a state where the high-frequency driving of the inverter circuit 76 is maintained. In addition, since the high-frequency driving of the inverter circuit 76 can be performed, the size of the transformer of the step-up circuit 78 can be decreased, and size reduction of the high voltage generation unit 40 can be achieved.

Hysteresis may be provided by causing the target output power as the threshold values to overlap with each other to form a range in the target output power as in the target output power control information 33B illustrated in FIG. 8, so that a change of the direct current voltage to be output from the DC-DC converter 74 and switching between the PWM control and the PFM control of the inverter circuit 76 are not rapidly performed. In this case, the target output power as the threshold values is different between a case where the target output power is decreased from the current target output power and a case where the target output power is increased from the current target output power. Thus, in the case of changing the target output power, each of the high voltage control unit 70 and the output voltage change control unit 72 performs the control in the tube voltage control processing by referring to the target output power control information 33B after determining whether the target output power after the change is increased or decreased from the current target output power.

The tube current changes depending on a filament temperature. Thus, the tube voltage control processing can also be applied to calibration of adjusting a relationship between the filament current and the tube current of the radiation tube 13. For example, the filament current is gradually increased, and a record value of the tube current is monitored. In a case where the tube voltage record value detected by the record value FB unit 82 and the output power corresponding to the tube voltage record value exceed a threshold value, the direct current voltage to be output from the DC-DC converter 74 is controlled to be increased. While a form of the control device 30 that performs the control using the target output power control information 33B obtained in advance has been described in each form, a form of the control device 30 that performs the control without using the target output power control information 33B is also possible. For example, the control device 30 may acquire the actual pulse width or the actual period of the inverter circuit 76 and control the acquired pulse width or the acquired period to be adjusted within a predetermined range. For example, a form of controlling the direct current voltage to be output from the DC-DC converter 74 in a case where the pulse width P is other than the pulse widths P2 and P1 illustrated in (1) of FIG. 4 is also possible. In this case, a form of controlling the direct current voltage to be output from the DC-DC converter 74 in a case where the number of times the pulse width P falls outside the pulse widths P2 and P1 exceeds a designated number of times, by taking reproducibility or a degree of fluctuation of the tube current into consideration is also possible.

While a form of the high voltage generation unit 40 comprising the DC-DC converter 74 that outputs the direct current voltage from the direct current power supply voltage has been described in the above forms, a form of comprising an AC-DC converter that outputs the direct current voltage from the power supply voltage which is an alternating current voltage instead of the DC-DC converter 74 is also possible.

While a form of the radiography apparatus 1 that is a mobile type radiography apparatus including a C arm has been described in the above forms, the radiography apparatus 1 is not limited to the present form. For example, a form of using a radiography apparatus of a mobile type including the radiation emitting unit 10 and the radiation detector 38 that is a so-called electronic cassette in combination with each other is also possible. In addition, for example, the radiography apparatus 1 may be the radiography apparatus 1 of a portable type that is carried and moved by the operator. In addition, the radiography apparatus 1 is not limited to the mobile type radiography apparatus 1 and may be the radiography apparatus 1 of a stationary type.

In addition, in the above forms, for example, the following various processors can be used as a hardware structure of a processing unit that executes various types of processing of the system control unit 60, the exposure condition control unit 62, and the analysis unit 64. The various processors include, in addition to a CPU that is a general-purpose processor functioning as various processing units by executing software (program) as described above, a programmable logic device (PLD) such as a field programmable gate array (FPGA) that is a processor having a circuit configuration changeable after manufacture, a dedicated electric circuit such as an application specific integrated circuit (ASIC) that is a processor having a circuit configuration dedicatedly designed to execute specific processing, and the like.

One processing unit may be composed of one of the various processors or may be composed of a combination of two or more processors of the same type or different types (for example, a combination of a plurality of FPGAs or a combination of a CPU and an FPGA). In addition, a plurality of processing units may be composed of one processor.

As an example of the plurality of processing units composed of one processor, first, as represented by a computer such as a client and a server, a form of one processor that is composed of a combination of one or more CPUs and software and that functions as the plurality of processing units is possible. Second, as represented by a system on chip (SoC), a form of using a processor that implements functions of the entire system including the plurality of processing units in one integrated circuit (IC) chip is possible. Accordingly, various processing units are configured using one or more of the various processors as the hardware structure.

Furthermore, more specifically, an electric circuit (circuitry) in which circuit elements such as semiconductor elements are combined can be used as the hardware structure of the various processors.

In addition, while an aspect of storing (installing) the control program 33A in advance in the storage unit 33 has been described in each form, the control program 33A is not limited to this aspect. The control program 33A may be provided in the form of a recording on a recording medium such as a compact disc read only memory (CD-ROM), a digital versatile disc read only memory (DVD-ROM), and a universal serial bus (USB) memory. In addition, a form of downloading the control program 33A from the external apparatus through the network is also possible.

The disclosure of JP2021-172693 filed on Oct. 21, 2021 in Japan is incorporated in the present specification by reference in its entirety.

All documents, patent applications, and technical standards described in the present specification are incorporated in the present specification by reference to the same extent as in a case where individual documents, patent applications, and technical standards are specifically and individually indicated to be incorporated by reference.

What is claimed is:

1. A control device comprising:

at least one processor;

a converter that outputs a direct current voltage from a power supply voltage;

an inverter circuit that converts the direct current voltage output from the converter into an alternating current voltage;

a step-up circuit that steps up the alternating current voltage output from the inverter circuit;

a rectifier that rectifies the alternating current voltage output from the step-up circuit to a direct current tube voltage; and a radiation tube including an electron gun that releases electrons as a tube current in a case where the tube voltage is applied to the radiation tube, the control device controlling the tube voltage and the tube current supplied to the radiation tube that emits radiation, wherein the processor is configured to:

control the converter to output the direct current voltage corresponding to output target power derived from an output target tube voltage and an output target tube current;

compare the output target power with a first threshold value, a second threshold value, and a third threshold value;

based on determining that the output target power is less than or equal to the first threshold value and exceeds the second threshold value lower than the first threshold value, fix the direct current voltage to a first voltage, fix a frequency of the inverter circuit, and control a pulse width of the inverter circuit such that a tube voltage record value matches the output target tube voltage;

based on determining that the output target power is less than or equal to the second threshold value, fix the direct current voltage to the first voltage, fix the pulse width of the inverter circuit, and control the frequency of the inverter circuit such that the tube voltage record value matches the output target tube voltage; and based on determining that the output target power is less than or equal to the third threshold value lower than the second threshold value, decrease the direct current voltage to a second voltage lower than the first voltage, and control the pulse width and the frequency of the inverter circuit such that the tube voltage record value matches the output target tube voltage.

2. The control device according to claim 1, wherein the converter is a DC-DC converter.

3. The control device according to claim 1, wherein the processor is configured to decrease the direct current voltage stepwise from the first voltage to the second voltage.

4. A control device comprising:

at least one processor;

a converter that outputs a direct current voltage from a power supply voltage;

an inverter circuit that converts the direct current voltage output from the converter into an alternating current voltage;

a step-up circuit that steps up the alternating current voltage output from the inverter circuit;

a rectifier that rectifies the alternating current voltage output from the step-up circuit to a direct current tube voltage; and a radiation tube including an electron gun that releases electrons as a tube current in a case where the tube voltage is applied to the radiation tube, the control device controlling the tube voltage and the tube current supplied to the radiation tube that emits radiation, wherein the processor is configured to:

control the converter to output the direct current voltage corresponding to output target power derived from an output target tube voltage and an output target tube current;

compare the output target power with a first threshold value, a second threshold value, and a third threshold value;

based on determining that the output target power is less than or equal to the first threshold value and exceeds the second threshold value lower than the first threshold value, fix the direct current voltage to a first voltage, fix a pulse width of the inverter circuit, and control a frequency of the inverter circuit such that a tube voltage record value matches the output target tube voltage;

based on determining that the output target power is less than or equal to the second threshold value, fix the direct current voltage to the first voltage, fix the frequency of the inverter circuit, and control the pulse width of the inverter circuit such that the tube voltage record value matches the output target tube voltage; and based on determining that the output target power is less than or equal to the third threshold value lower than the second threshold value, decrease the direct current voltage to a second voltage lower than the first voltage, and control the pulse width and the frequency of the inverter circuit such that the tube voltage record value matches the output target tube voltage.

5. The control device according to claim 4, wherein the converter is a DC-DC converter.

6. The control device according to claim 4, wherein the processor is configured to decrease the direct current voltage stepwise from the first voltage to the second voltage.

7. A control method executed by a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, the control method comprising:

controlling the converter to output the direct current voltage corresponding to output target power derived from an output target tube voltage and an output target tube current;

compare the output target power with a first threshold value, a second threshold value, and a third threshold value;

based on determining that the output target power is less than or equal to the first threshold value and exceeds the second threshold value lower than the first threshold value, fixing the direct current voltage to a first voltage, fixing a frequency of the inverter circuit, and controlling a pulse width of the inverter circuit such that a tube voltage record value matches the output target tube voltage;

based on determining that the output target power is less than or equal to the second threshold value, fixing the direct current voltage to the first voltage, fixing the pulse width of the inverter circuit, and controlling the frequency of the inverter circuit such that the tube voltage record value matches the output target tube voltage; and based on determining that the output target power is less than or equal to the third threshold value lower than the second threshold value, decreasing the direct current voltage to a second voltage lower than the first voltage, and controlling the pulse width and the frequency of the inverter circuit such that the tube voltage record value matches the output target tube voltage.

8. A control method executed by a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, the control method comprising:

controlling the converter to output the direct current voltage corresponding to output target power derived from an output target tube voltage and an output target tube current;

compare the output target power with a first threshold value, a second threshold value, and a third threshold value;

based on determining that the output target power is less than or equal to the first threshold value and exceeds the second threshold value lower than the first threshold value, fixing the direct current voltage to a first voltage, fixing a pulse width of the inverter circuit, and controlling a frequency of the inverter circuit such that a tube voltage record value matches the output target tube voltage;

based on determining that the output target power is less than or equal to the second threshold value, fixing the direct current voltage to the first voltage, fixing the frequency of the inverter circuit, and controlling the pulse width of the inverter circuit such that the tube voltage record value matches the output target tube voltage; and based on determining that the output target power is less than or equal to the third threshold value lower than the second threshold value, decreasing the direct current voltage to a second voltage lower than the first voltage, and controlling the pulse width and the frequency of the inverter circuit such that the tube voltage record value matches the output target tube voltage.

9. A non-transitory computer readable medium storing a control program for causing a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, to execute:

controlling the converter to output the direct current voltage corresponding to output target power derived from an output target tube voltage and an output target tube current;

compare the output target power with a first threshold value, a second threshold value, and a third threshold value;

based on determining that the output target power is less than or equal to the first threshold value and exceeds the second threshold value lower than the first threshold value, fixing the direct current voltage to a first voltage, fixing a frequency of the inverter circuit, and controlling a pulse width of the inverter circuit such that a tube voltage record value matches the output target tube voltage;

based on determining that the output target power is less than or equal to the second threshold value, fixing the direct current voltage to the first voltage, fixing the pulse width of the inverter circuit, and controlling the frequency of the inverter circuit such that the tube voltage record value matches the output target tube voltage; and based on determining that the output target power is less than or equal to the third threshold value lower than the second threshold value, decreasing the direct current voltage to a second voltage lower than the first voltage, and controlling the pulse width and the frequency of the inverter circuit such that the tube voltage record value matches the output target tube voltage.

10. A non-transitory computer readable medium storing a control program for causing a processor of a control device including at least one processor, a converter that outputs a direct current voltage from a power supply voltage, an inverter circuit that converts the direct current voltage output from the converter into an alternating current voltage, a step-up circuit that steps up the alternating current voltage output from the inverter circuit, a rectifier that rectifies the alternating current voltage output from the step-up circuit to a direct current tube voltage, and a radiation tube including an electron gun that releases electrons as a tube current in a case where the tube voltage is applied to the radiation tube, and controlling the tube voltage and the tube current supplied to the radiation tube that emits radiation, to execute:

controlling the converter to output the direct current voltage corresponding to output target power derived from an output target tube voltage and an output target tube current;

compare the output target power with a first threshold value, a second threshold value, and a third threshold value;

based on determining that the output target power is less than or equal to the first threshold value and exceeds the second threshold value lower than the first threshold value, fixing the direct current voltage to a first voltage, fixing a pulse width of the inverter circuit, and controlling a frequency of the inverter circuit such that a tube voltage record value matches the output target tube voltage;

based on determining that the output target power is less than or equal to the second threshold value, fixing the direct current voltage to the first voltage, fixing the frequency of the inverter circuit, and controlling the pulse width of the inverter circuit such that the tube voltage record value matches the output target tube voltage; and based on determining that the output target power is less than or equal to the third threshold value lower than the second threshold value, decreasing the direct current voltage to a second voltage lower than the first voltage, and controlling the pulse width and the frequency of the inverter circuit such that the tube voltage record value matches the output target tube voltage.

* * * * *